US008698396B2

(12) United States Patent
Maindron et al.

(10) Patent No.: US 8,698,396 B2
(45) Date of Patent: Apr. 15, 2014

(54) ORGANIC OPTOELECTRONIC DEVICE AND METHOD FOR ENCAPSULATING SAME

(75) Inventors: Tony Maindron, Grenoble (FR); Bernard Aventurier, Saint Joseph de Riviere (FR); Julia De Girolamo, La Tronche (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/640,841

(22) PCT Filed: Apr. 1, 2011

(86) PCT No.: PCT/IB2011/051412
§ 371 (c)(1),
(2), (4) Date: Nov. 7, 2012

(87) PCT Pub. No.: WO2011/128802
PCT Pub. Date: Oct. 20, 2011

(65) Prior Publication Data
US 2013/0049580 A1    Feb. 28, 2013

(30) Foreign Application Priority Data

Apr. 12, 2010  (FR) ...................... 10 01522

(51) Int. Cl.
*H01J 1/62*    (2006.01)
(52) U.S. Cl.
USPC ........................................ 313/512; 445/25
(58) Field of Classification Search
USPC ........................................ 313/512; 445/25
See application file for complete search history.

(56) References Cited

U.S. PATENT DOCUMENTS 8,362,697  B2 *   1/2013  Sakaguchi et al. ............ 313/512
2005/0248270 A1 *  11/2005  Ghosh et al. .................. 313/512
(Continued)

FOREIGN PATENT DOCUMENTS

DE    10 2006 015043    10/2007
EP        1 986 248       10/2008
(Continued)

OTHER PUBLICATIONS

International Search Report and Written Opinion of the Searching Authority for Application No. PCT/IB2011/051412, dated Jun. 21, 2011.

*Primary Examiner* — Mary Ellen Bowman
(74) *Attorney, Agent, or Firm* — Alston & Bird LLP

(57) ABSTRACT

The invention relates to an organic optoelectronic device, such as a display device, which is protected from the surrounding air by a sealed encapsulation which includes thin layers, and to a method for encapsulating the same. Said device has an electroluminescent unit having at least one active area (5) covered with a multi-layer encapsulation structure (201) and an electric connection area adjacent to the active area, the encapsulation structure including n stack(s) (n≥1) comprising an inorganic film F1, . . . , Fn and a photosensitive layer C1, . . . , Cn, including an internal stack F1/C1 in which F1 covers the active area and C1, which is deposited in a liquid phase, is superposed thereon. According to the invention, the layer or each layer C1, Cn is etched and covers the film F1, . . . , Fn by extending around a peripheral edge (5a) of the active area in at least one structured surrounding portion (210, 211, 212) ending beyond the adjacent connection area, and if n>2, the or each layer C2, . . . , Cn surrounds the layer C1, . . . , Cn−1 of the immediately underlying stack, such that the layer or each layer C1, . . . , Cn passivates the film F1, Fn and laterally protects the underlying active area from the developing solutions and solvents used for etching said layer C1, . . . , Cn.

17 Claims, 6 Drawing Sheets

(56) References Cited

U.S. PATENT DOCUMENTS

2006/0087230 A1    4/2006   Ghosh et al.
2011/0198627 A1    8/2011   Maindron et al.

FOREIGN PATENT DOCUMENTS

FR    2 936 651    4/2010
WO    WO-2007 113177    10/2007

* cited by examiner

ORGANIC OPTOELECTRONIC DEVICE AND METHOD FOR ENCAPSULATING SAME

FIELD

The present invention relates to an organic optoelectronic device, such as a display, lighting or signaling device, that is protected from ambient air by a sealed encapsulation comprising thin films, and to a process for encapsulating such a device. The invention especially applies to devices comprising organic light-emitting diodes (OLEDs), such as microdisplays.

BACKGROUND

It is known that organic optoelectronic devices such as OLEDs, devices comprising organic photovoltaic cells and those comprising organic TFTs, need to be encapsulated to ensure that their sensitive components are protected from the gaseous species of the atmosphere (mainly oxygen and water vapor). This is because, if suitable protection is not provided, there is a risk that the device will subsequently degrade, this degradation exhibiting itself mainly by the appearance of non-emissive black spots in the case of OLEDs, which spots are in fact the result of water vapor penetrating into the diode and degrading the cathode (or anode)/organic film(s) interface.

This encapsulation can typically be achieved using a glass cap adhesively bonded to the organic device using a specific adhesive especially having a low water permeability. In general a solid moisture getter is added between the substrate and the cap in order to increase the lifetime of the device.

For certain applications, but also to reduce cost, thin films have been developed that act as barriers and the role of which is comparable to the cap/getter assembly, i.e. they protect the subjacent device from attack by moisture. Generally, these barrier films are oxides, nitrides or oxynitrides or, in certain cases, they may be thin metal films unless the light-emitting unit is a top-emitting structure in which case the barrier films must be transparent.

These thin films are deposited by standard vacuum deposition processes such as chemical vapor deposition (CVD), which is optionally plasma enhanced (PECVD), atomic layer deposition (ALD, sometimes called ALCVD) or by physical vapor deposition (PVD) processes including evaporation and sputtering. To produce a barrier, CVD and in particular ALD technologies are especially preferred because, being low-temperature technologies, they provide, at temperatures most often below 110° C., barrier films that are dense, have few pinholes, that are 100% conformal and that are compatible with OLEDs. Thus a film of $Al_2O_3$ deposited at a low temperature by ALD has been obtained with a pinhole density as low as 38 /cm². For microdisplay applications, this pinhole density is nevertheless too high because, if a microdisplay with an area of 45 mm² is considered, the above density leads to 17 pinholes per microdisplay, i.e. potentially 17 dark spots on the OLED display. Indeed, even though these dark spots intrinsic to the fabrication process are microscopic, their presence is unacceptable in an OLED device the image of which is magnified by suitable optics, and additional "extrinsic" dark spots due to the presence of undesirable particles on the surface of the device during the thin-film encapsulation must furthermore be taken into account.

Moreover, it is known that it is necessary to provide long-term protection of $Al_2O_3$ deposited by ALD from water because it has a tendency to hydrolyze into $Al(OH)_x$. It has therefore been sought to durably passivate the barrier that such an $Al_2O_3$ film forms using more chemically inert and more stable inorganic materials such as $SiO_2$, $Si_3N_4$ or $SiO_xN_y$, deposited by low-temperature PECVD, which passivation also allows residual pinholes in these $Al_2O_3$ films to be filled.

As a variant, it has been sought to passivate these ALD-deposited $Al_2O_3$ films with relatively thick organic films based on "planarizing" polymers that are supposed to alleviate the drawback of the aforementioned undesirable particles by coating them with a multilayer of alternating organic and inorganic films, such as the Barix™ multilayer from Vitex. One drawback of this solution lies in the gaseous-phase "flash" evaporation process (i.e. evaporation of the monomer, condensation on the substrate, then UV curing) used since it is relatively costly in terms of time.

It is difficult to envision using other deposition techniques that are less costly in terms of time such as liquid-phase deposition because liquid-phase deposition requires polymer solutions containing solvents that are liable to dissolve the films of the subjacent light-emitting unit.

SUMMARY

One aim of the present invention is to provide an organic optoelectronic device, such as an OLED display, lighting or signaling device, that allows the aforementioned drawbacks to be alleviated while providing reliable and durable protection of the light-emitting unit at a lower cost, this device comprising a light-emitting unit possessing at least one active light-emitting zone coated with a sealed encapsulating multilayer structure, and an electrical connection zone adjacent the or each active zone, the encapsulating structure comprising n (n≥1) inorganic film F1, . . . , Fn/photosensitive polymer layer C1, . . . , Cn multilayer(s) including an internal multilayer F1/C1, where the film F1 covers the or each active zone and is surmounted by the layer C1 which is deposited in liquid phase.

For this purpose, a device according to the invention is such that the or each layer C1, . . . , Cn is patterned (by photolithography) and covers the film F1, . . . , Fn by extending around a peripheral edge of the or each active zone in at least one structured enveloping portion that ends short of the adjacent connection zone, where if n≥2 the or each layer C2, . . . , Cn, which is structured so as to envelope the layer C1, . . . , Cn−1 of the multilayer immediately subjacent, is such that the or each layer C1, . . . , Cn passivates the film F1, . . . , Fn and laterally protects the or each subjacent active zone from solvents and developing solutions used to pattern this layer C1, . . . , Cn.

As will be described below, this patterned structure, which completely encapsulates the or each photosensitive layer of the or each active zone of the light-emitting unit (i.e. the structure not only encapsulates the external face of this active zone but also its side faces), may be obtained with precision using photolithography, i.e. via local exposure of the photosensitive layer by means of a mask and development of this layer, this pattern allowing said at least one portion enveloping each active zone to be structured and therefore localized with precision relative to the adjacent electrical connection zone, which must be left free, and also relative to the enveloping portions of adjacent active zones.

Advantageously, the or each photosensitive layer C1, . . . , Cn may be based on a positive photolithography resist. The expression "positive resist" is understood, as is known, to means a resist that is polymerized on deposition, the parts selectively exposed to UV radiation through a mask being depolymerized and then dissolved during development. As a variant, this resist may be a negative resist (i.e. by definition its exposed zone is polymerized and thus becomes insoluble during development).

According to another feature of the invention, the or each film F1, ..., Fn may be deposited on the or each active zone by atomic layer deposition (ALD) or else by plasma enhanced chemical vapor deposition (PECVD), and is based on at least one inorganic compound chosen from the group consisting of compounds of formula $Al_xO_y$, $SiO_x$, $Si_xN_y$, $SiO_xN_y$, ZnSe, $Sb_2O_3$ and of transparent conductive oxides (TCOs) optionally combined with a metal such as aluminum.

According to a first embodiment of the invention, the or each film F1, ..., Fn is deposited by ALD and is based on at least one aluminum oxide $Al_xO_y$ optionally combined with a compound of formula $SiO_x$, $Si_xN_y$ or $SiO_xN_y$, and said at least one enveloping portion of the or each layer C1, ..., Cn may then extend on the light-emitting unit beyond the periphery of this film.

According to a second embodiment of the invention, the or each film F1, ..., Fn is deposited by ALD and is based on at least one transparent conductive oxide (TCO) optionally combined with a metal, such as a zinc oxide of formula ZnO or a thin film of ZnO:Al, and said at least one enveloping portion of the or each layer C1, ..., Cn can then extend to make contact with the periphery of this film.

It will be noted that, with regard to both the first and the second embodiment, wet deposition of the or each photosensitive layer C1, ..., Cn is possible by virtue of the excellent passivating qualities of the film F1, ..., Fn that is advantageously based on aluminum oxide or zinc oxide, which film provides a pre-encapsulation.

Advantageously, the or each layer C1, ..., Cn isolating the or each active zone may itself be covered with an external inorganic dielectric barrier film that surmounts both the or each active zone and covers all of its or its corresponding last layer C1, ..., Cn and its adjacent connection zone, so as to isolate said at least one enveloping portion of this layer from the exterior.

According to another aspect of the invention, said device may furthermore be provided with a protective plate (possibly made of a material transparent to the light emitted by the light-emitting unit, such as glass or a plastic), which plate is bonded under pressure to the encapsulating structure surmounting the or each active zone by means of an adhesive, and said portion enveloping the or each active zone is indented, for example giving it a regularly crenellated shape, so as to maximize the contact between the adhesive and the regions of the light-emitting unit located between two adjacent enveloping portions without adversely affecting the adhesion of the latter to this unit.

According to a variant embodiment of the invention, the or each layer C1, ..., Cn may be patterned so that its said at least one enveloping portion comprises a protruding peripheral portion that continuously surpasses said edge of the or each active zone so as to encapsulate the latter, and at least one auxiliary peripheral enveloping portion that lie(s) at a distance away from and surround(s) this protruding portion and that, in the case of a plurality of auxiliary portions, mutually surround one another, and said external dielectric barrier film covers these auxiliary portions so as to form a plurality of surfaces that lie parallel to one another and perpendicular to the plane of the substrate, which surfaces form as many obstacles to lateral penetration of water vapor toward the active zone.

According to another feature of the invention, said optoelectronic device may comprise a multitude of active zones, such as microdisplays, which zones are all surmounted by films F1, ..., Fn and by layers C1, ..., Cn that each surpass said subjacent edge but that lie a distance away from said adjacent enveloping portion of each neighboring active zone, an external inorganic dielectric film optionally surmounting the layers or respective last layers of the active zones while also covering their adjacent connection zones.

Advantageously, this device may form at least one color microdisplay that is defined by the or each active zone and that comprises color filters or color-changing means opposite color dots corresponding to each pixel of the microdisplay.

Even more advantageously, this device may comprise a substrate coated, on at least one of its sides, with the light-emitting unit, said light-emitting unit being an OLED unit comprising at least two, internal and external, electrodes between which a light-emitting structure is sandwiched and at least one of which is transparent to the emitted light, and the encapsulating structure may then cover the external electrode.

According to the invention, a process for encapsulating a device such as defined above comprises the following steps in succession:

a) an internal inorganic film F1 is deposited on said at least one active zone, for example on an external electrode of said light-emitting unit, by atomic layer deposition (ALD) or else by plasma enhanced chemical vapor deposition (PECVD), this film F1 being based on at least one inorganic compound preferably chosen from the group consisting of compounds of formula $Al_xO_y$, $SiO_x$, $Si_xN_y$, $SiO_xN_y$, ZnSe, $Sb_2O_3$ and of transparent conductive oxides (TCOs) optionally combined with a metal;

b) the light-emitting unit is covered with an internal, photosensitive polymer layer C1 deposited in its liquid phase so that said layer continuously covers the or each film F1 and also the adjacent connection zone, an adhesion promoter, for example a silane, optionally being deposited beforehand on this film F1;

c) the layer C1 is exposed in preset regions of the light-emitting unit by selectively masking it from exposing radiation, so that it is, on the one hand, polymerized following this exposure above the or each active zone covered with the film F1 and in said at least one enveloping portion lying a distance away from the enveloping portion of the or each adjacent active zone and, on the other hand, depolymerized over the rest of the area of the unit including the or each connection zone, so that the polymerized layer C1 encapsulates the film F1 and the or each active zone so as to protect them during step d);

d) the polymerized layer C1 is developed by soaking in a bath, e.g. in a bath of tetramethylammonium hydroxide (TMAH), optionally followed by an additional exposure of the layer C1; and then e) these steps a) to d) are optionally repeated at least once, at least one other inorganic film F2, ..., Fn/photosensitive polymer layer C2, ..., Cn multilayer being deposited, the or each film F2, ..., Fn being deposited on the layer C1, ..., Cn−1 and the or each polymerized layer C2, Cn enveloping the layer C1, ..., Cn−1.

It will be noted that step a) is preferably carried out by ALD, low-temperature deposition making it possible to obtain a high-density, very-low-permeability film that follows micro- or nano-reliefs in the subjacent surface as closely as possible.

It will also be noted that this film deposited by ALD allows the use of polar or nonpolar solvents e.g. ethanol, water, acetone and photoresist developers/strippers such as TMAH and ROR.

As for step b), it may be carried out using any coating technique, such as for example spin coating or dip coating.

Preferably, by way of photosensitive polymer for the layer C1, . . . , Cn, a positive photolithography resist is used, and, in step c), the or each photosensitive layer surmounting the or each active zone is selectively masked by means of a mask facing and surpassing said peripheral edge so that this layer is thereby protected from exposure and remains polymerized including in said at least one corresponding enveloping portion, in contrast to the rest of this layer which is depolymerized by this exposure with a view to dissolving it.

According to the aforementioned first embodiment of the invention, at least one dielectric inorganic compound chosen from the group consisting of compounds of formula $Al_xO_y$, $SiO_x$, $Si_xN_y$, $SiO_xN_y$, ZnSe and $Sb_2O_3$ is used for the or each film F1, . . . , Fn to be deposited in step a), and, following step d), said at least one enveloping portion of the or each layer C1, . . . , Cn extends, on the light-emitting unit, beyond the periphery of this film.

According to the aforementioned second embodiment of the invention, at least one transparent conductive oxide (TCO) optionally combined with a metal, such as a zinc oxide of formula ZnO or a thin film of ZnO:Al, is used for the or each film F1, . . . , Fn to be deposited in step a), and, following step d), this film is wet etched using the protruding polymerized layer C1, . . . , Cn surmounting the or each active zone as a mask so that said at least one enveloping portion of this layer extends to make contact with the periphery of this film and so that the latter is removed from the unit everywhere else.

According to another feature of the invention, it is possible, following step d), to etch the or each polymerized layer C1, . . . , Cn using a dry etching operation, such as a reactive ion etching (RIE) process or an oxygen plasma, so as to reduce the thickness of said layer and therefore meet microdisplay specifications regarding the problem of cross-talk between pixels.

According to another feature of the invention, it is possible, following step d), and optionally following said dry etching operation, to conformally deposit an external inorganic barrier film at a low temperature, said film both surmounting the or each active zone and covering all of the corresponding layer C1, . . . , Cn and its adjacent connection zone so as to isolate said at least one enveloping portion of this layer from the exterior, this conformal deposition preferably being produced by atomic layer deposition (ALD) or plasma enhanced chemical vapor deposition (PECVD) of at least one dielectric compound.

It will be noted that the encapsulating structure obtained in this way forms a robust monolithic encapsulation and that, in the specific case where the thickness of the barrier multilayer is of particular importance (the case for microdisplays especially, where the multilayer must be sufficiently thin to prevent cross-talk between pixels), thinning of the layer C1, . . . , Cn by the aforementioned dry etching operation allows the distance separating each pixel of the microdisplay and the corresponding color filter to be perfectly controlled, at least in the barrier multilayer.

BRIEF DESCRIPTION OF THE DRAWINGS

Other advantages, features and details of the invention will become apparent from the following description given with reference to the appended drawings, provided merely by way of example, and in which.

DETAILED DESCRIPTION OF THE INVENTION

Figure 1:
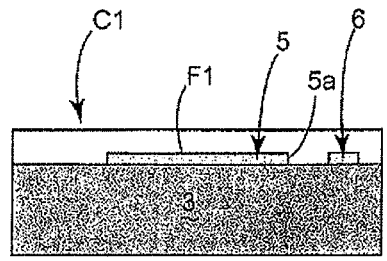
FIG. 1 is a schematic cross-sectional view of a microdisplay-comprising device according to the first embodiment of the invention during its fabrication, following step b) of coating the light-emitting unit with the positive resist layer C1, this layer especially covering a dielectric film F1.

The multilayer encapsulating structure 1, 101, 201 illustrated in these figures for example covers the external emission surface of a light-emitting optoelectronic device 2, the sensitive components of which are to be protected from moisture and oxygen in the ambient air.

The illustrated optoelectronic device 2 is for example an OLED microdisplay comprising, as is known, a substrate 3 typically made of silicon coated with a light-emitting unit 4 comprising an active zone 5 and an electrical connection zone 6. The light-emitting unit 4 has two, internal and external, electrodes (not shown) between which a light-emitting structure (not shown) is sandwiched, at least one of the electrodes (in this example the external electrode, such as the cathode) being transparent or semitransparent to the emitted light in order to allow said light to radiate via the active zone 5 toward the exterior of the device 2.

The external electrode preferably consists of a metal such as silver, aluminum or samarium because of the transparency properties of these metals in the visible domain and for their electrical conductivity at small thicknesses (the external electrode is for example between 10 nm and 30 nm in thickness). An additional layer, commonly called a capping layer, may advantageously be placed on the external electrode: this index-breaking layer acting to improve the light extraction coefficient of the OLED emitting structure. It may for example be an $SiO_x$ layer evaporated through a mask with the dimensions of the display, in the same way as the external electrode. The OLED emitting structure for example consists of an organic-film multilayer designed to transfer electrons and holes arriving from the electrodes, which electrons and holes recombine generating excitons and therefore the light emission.

Figure 6:
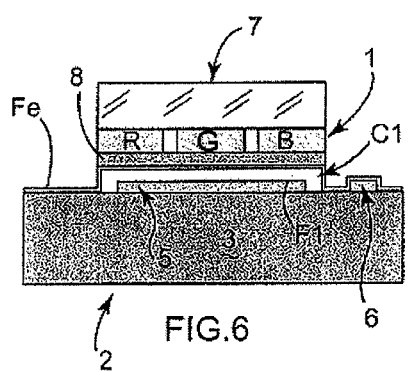
FIG. 6 is a schematic cross-sectional view of the device in FIG. 4 at the end of the fabrication process according to said first embodiment of the invention, after a final step of adhesively bonding a transparent protective cap equipped with color filters to the device in FIG. 5.

As may be seen in FIG. 6 in particular, an encapsulating structure 1 may comprise, according to the first embodiment of the invention:

- a "pre-encapsulation" internal, inorganic dielectric film F1 preferably deposited by ALD on each active zone 5 of the OLED unit, which film is for example based on an oxide $Al_2O_3$ advantageously deposited at a temperature below 110° C. in order to prevent the OLED structure from deteriorating, and typically at 85° C. for a thickness of between 10 nm and 30 nm (for example 25 nm), this film optionally being combined with PECVD $Si_3N_4$ or $SiO_2$ (e.g. ALD $Al_2O_3/Si_3N_4$ or ALD $Al_2O_3/SiO_2$), or else being based on a multilayer of one or more $Al_2O_3/ZnO$ multilayers (all of the multilayer possibly being produced by ALD);
- a polymer layer C1, for example based on a positive photoresist such as "TELR-P002" or "JSR420", that envelopes each active zone 5 covered with the film F1 and that continuously surpasses the periphery of this film F1 but that lies a distance away from the adjacent connection zone 6 and the other polymer layers C1 enveloping the neighboring active zones 5;
- an external inorganic dielectric barrier film Fe which continuously covers the entire OLED unit (including the connection zones 6) and which is, for example, preferably made of $Al_2O_3$, $Si_3N_4$, $Al_2O_3/Si_3N_4$, or $SiO_2$ (deposited at a temperature below 110° C., typically at 85° C. for a thickness of between 10 nm and 30 nm, 25 nm for example);
- a protective cap 7 (for example made of glass or of plastic) that is provided, on its internal side, with R, G, B optical color filters placed facing corresponding color dots of each microdisplay pixel, and that is joined to the microdisplay under pressure using a UV-curable adhesive 8 (preferably an acrylate or epoxy).

FIG. 1 illustrates deposition of the layer C1 of positive resist over all of the OLED unit (with a thickness typically of between 300 nm and about 1 μm) including the connection zone 6 by spin-coating, the microdisplay active zone 5 having been coated beforehand with the inorganic film F1, an HMDS adhesion-promoting agent (of about a nm in thickness, obtained in an oven at 100° C. over 30s) optionally being deposited before the spin-coating. The resist may be baked at a baking temperature compatible with the organic OLED devices, which temperature should be below 110° C. for small-molecule OLEDs and below 140° C. for polymer OLEDs (also called PLEDs for polymer light-emitting diodes).

Figure 2:
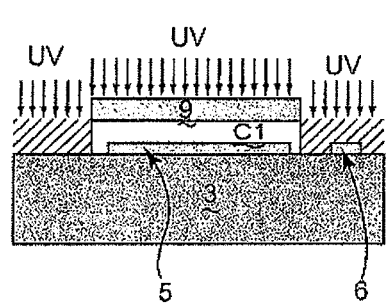
FIG. 2 is a schematic cross-sectional view of the device in FIG. 1, showing step c) of exposing this layer C1.

FIG. 2 shows exposure of the layer C1 beyond the active zone 5 of the microdisplay but from a point short of the adjacent contact-pad-comprising connection zone 6, so as to leave the latter free for subsequent connection of the back-end, by virtue of the photolithography mask 9 surmounting and surpassing this active zone 5 and thus preventing the depolymerization of the resist caused by exposure to UV radiation.

Figure 7:
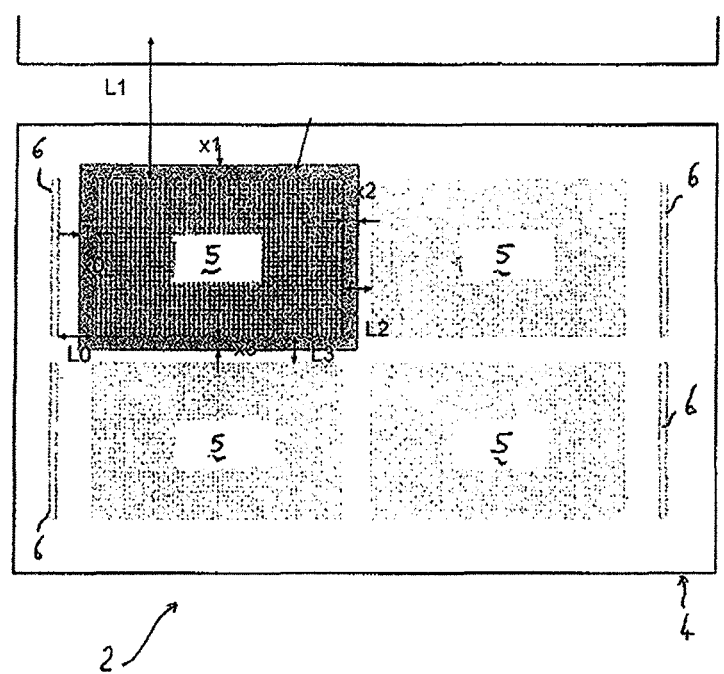
FIG. 7 is a partial schematic top view of two fields of a device comprising four microdisplays, the enveloping portion of a patterned photosensitive layer C1 according to one exemplary embodiment of the invention being shown for one of said microdisplays with respect to the neighboring microdisplays.

As illustrated in FIG. 7, care is taken to ensure a permitted maximum area is defined for each structured protruding portion 10 of the exposed layer C1, which portion is represented by a distance ($x_i$, $i=0, \ldots, 3$) between the peripheral edge 5a of each microdisplay active zone 5 and the peripheral edge of the mask 9 (which also defines the final edge of this portion 10). Specifically, the distance $x_i$ plays an important role preventing lateral penetration of water vapor into the device by diffusion and must be as large as possible in order to delay this penetration. This distance $x_i$ must also be chosen depending on the location of the other microdisplays contained in the same stepper field and in adjoining fields. The various distances $x_i$ may therefore be different. Furthermore, a given field may be diced with a saw, and, in the example in FIG. 7, this dicing may be carried out between the four microdisplays, meaning that, in this case, the distances $x_i$ must take into account the width of the saw-cuts.

Advantageously, in the case of a design comprising four displays per field, the following dimensional constraints on these distances $x_i$ may be respected:

~$x0 \leq L0$
~$x1 < (L1)/2$
~$x2 < (L2)/2$
~$x3 < (L3)/2$

Figure 3:
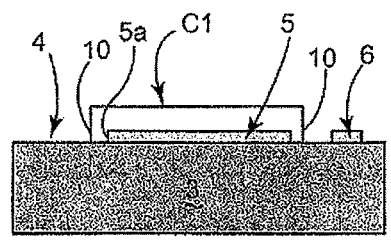
FIG. 3 is a schematic cross-sectional view of the device in FIG. 2 following step d) of developing the layer C1.

FIG. 3 shows the result of the step of developing (by dipping in a bath of TMAH developer, for example) the layer C1 thus selectively dissolved at a preset distance away from the active zone 5 and preserved in the polymerized state on and enveloping the latter, so as to protect the components of this active zone 5 from the bath of developer. This developer especially has the effect of freeing the contact pads of the connection zone 6. Following this developing step the layer C1 may be baked and, optionally, an additional exposure of the latter may be carried out depending on the long-term stability of the resist in one state or another.

It is possible at this stage, or after the etching step that is described next, to carry out a new step of exposing all of the residual positive resist (again using a UV lamp, for example at 365 nm). The exposure dose may for example be between 60 mW and 100 mW and be adjusted depending on the resist thickness. This is because it has been observed that such a step can improve the durability of the device by limiting the appearance of superficial blisters.

Figure 4:
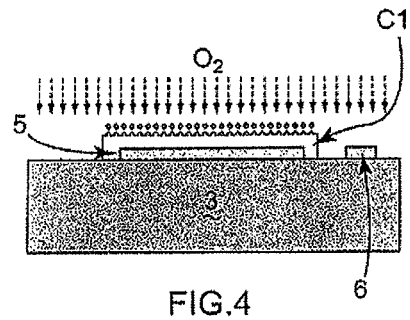
FIG. 4 is a schematic cross-sectional view of the device in FIG. 3 showing a subsequent step of dry etching the exposed and developed layer C1.

FIG. 4 shows a step of dry etching the remaining layer C1 using a reactive ion etching (RIE) technique or advantageously an oxygen ($O_2$) plasma, so as to reduce the overall thickness of this layer and make said thickness compatible with the specifications of microdisplays. This step allows, if the photosensitive layer C1 is initially chosen to be too thick for these specifications, as is the case for an initial thickness of 1 µm or more (for example 1.3 µm for the resist "JSR420"), to reduce, for the current generation of microdisplays, via this dry etching step, this thickness to about 0.5 µm. It will be noted that controlling the thickness of the encapsulation obtained using this dry etching step also makes it possible to control absorption.

It has be demonstrated that it is possible, by spin-coating "TELR-P002" resist with a thickness of between 300 nm and 400 nm, to thin this layer by etching to a thickness of between 150 nm and 250 nm. Reducing the polymer thickness also allows the durability of the device to be improved by allowing it to be more easily degassed in the optional step of baking this resist, which step will be described below. Thus, the barrier assembly formed by the two inorganic films and the intermediate polymer layer may be produced with a total thickness below 400 nm, or below 300 nm or even below 200 nm, while staying very effective. Such thicknesses allow the distance between the emitting structure and the color filters to be minimized, thus preventing cross-talk between adjacent pixels of different colors.

The etching step may optionally comprise two separate etching steps, so as to obtain a more isotropic etch and therefore a more uniform polymer layer.

At this point, a baking step may be envisioned in order to improve the durability of the device by allowing an at least partial degassing of the polymer layer. The temperature of this bake must be compatible with the OLED structure, as described above. A bake may be envisioned, for example, at a temperature of between 80° C. and 100° C. for a length of time ranging from 1 minute to 24 hours, for example for 2 hours.

Figure 5:
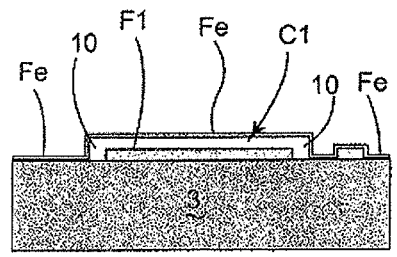
FIG. 5 is a schematic cross-sectional view of the device in FIG. 4 showing the result of a step of depositing an inorganic barrier film on the layer C1, following this dry-etching step.

FIG. 5 shows the result of a subsequent step of low-temperature conformal deposition (preferably by ALD or PECVD) of the external dielectric barrier film Fe on the layer C1, sealing the protruding portion 10 of the layer C1 and thus preventing lateral diffusion of water through this layer C1.

FIG. 6, as indicated above, shows an example of a protective packaging for the microdisplay, with a cap 7 equipped with R, G, B color filters.

Figure 8:
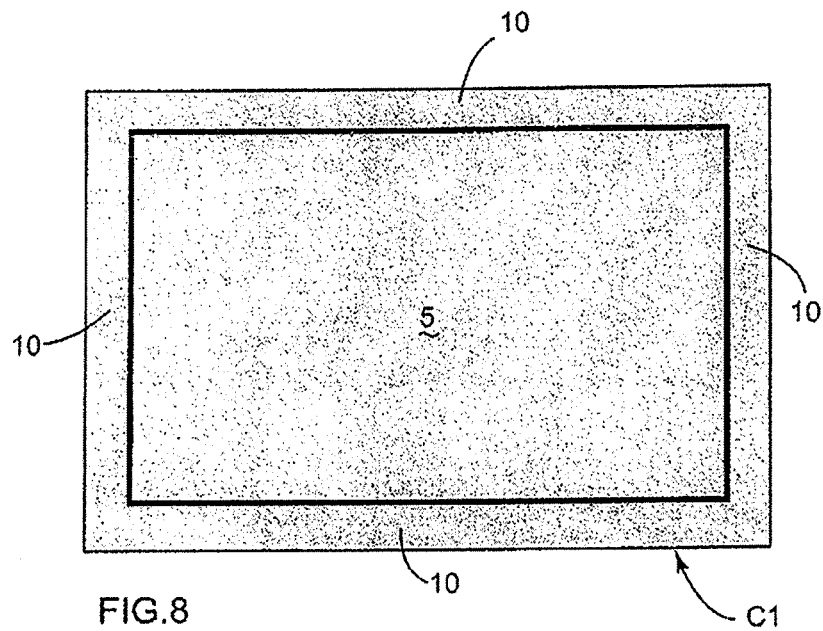
FIG. 8 is a schematic top view of a microdisplay of a device according to the exemplary embodiment of the invention illustrated in FIG. 7, showing an exemplary protruding border of the patterned photosensitive layer, with respect to the active zone of this microdisplay.
Figure 9:
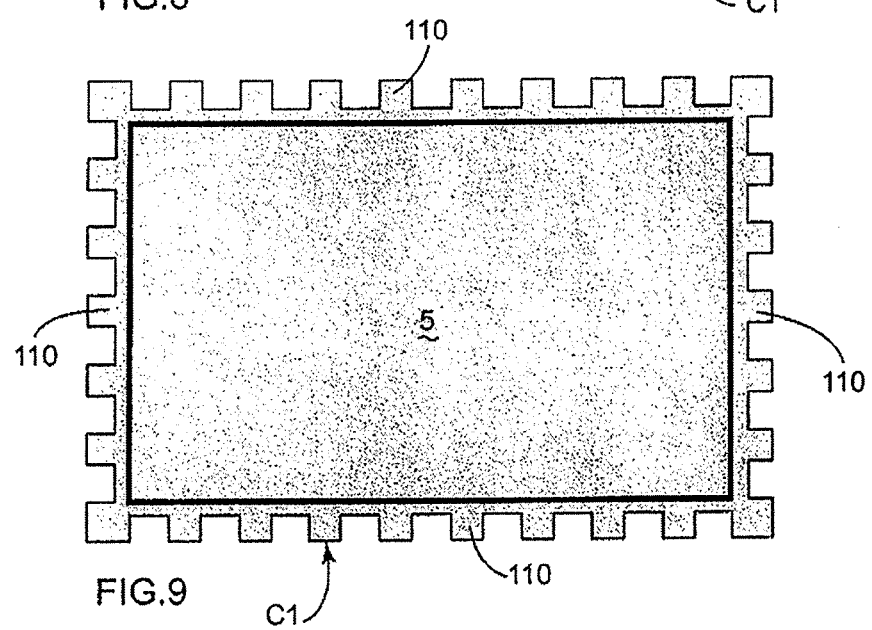
FIG. 9 is a partial schematic top view of a microdisplay of a device according to a variant of the embodiment of the invention illustrated in FIG. 8, showing a crenellated enveloping border portion of the patterned photosensitive layer, with respect to the active zone of this microdisplay.

FIG. 8 shows a possible geometry for the protruding peripheral portion 10 of the photosensitive layer C1 enveloping a microdisplay according to the invention, this protruding portion 10 having a rectangular outline of constant width, whereas the variant in FIG. 9 shows a rectangular enveloping portion 110 that is crenellated, for example like a postage stamp, in order to optimize the subsequent adhesion of the adhesive 8 of the cap 7 in regions, between the individual microdisplays to be separated by dicing, where the layer C1 has been removed while preserving a protrusion of sufficient width for the layer C1 enveloping the active zone 5 of the microdisplay to delay sufficiently the diffusion of water vapor and to adhere sufficiently to the OLED unit 4.

Figure 10:
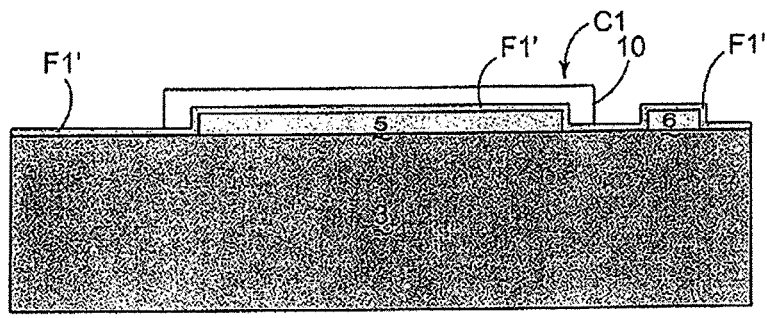
FIG. 10 is a schematic cross-sectional view of a microdisplay-comprising device according to the second embodiment of the invention during fabrication after step d) of developing an exposed layer C1 of positive resist covering a conductive film F1' deposited over the entire unit.
Figure 11:
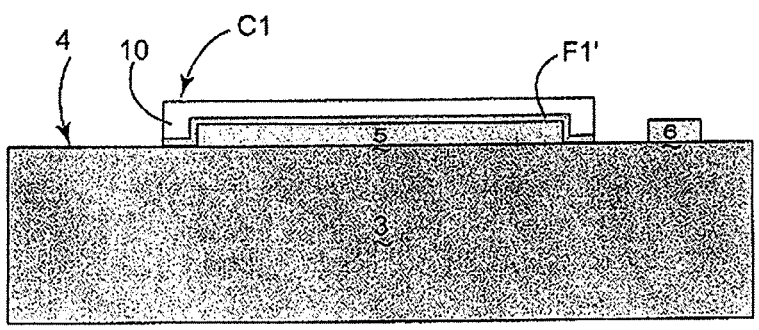
FIG. 11 is a schematic cross-sectional view of the device in FIG. 10 following a subsequent step of wet etching this film F1' so as to selectively remove it from above the layer C1.
Figure 12:
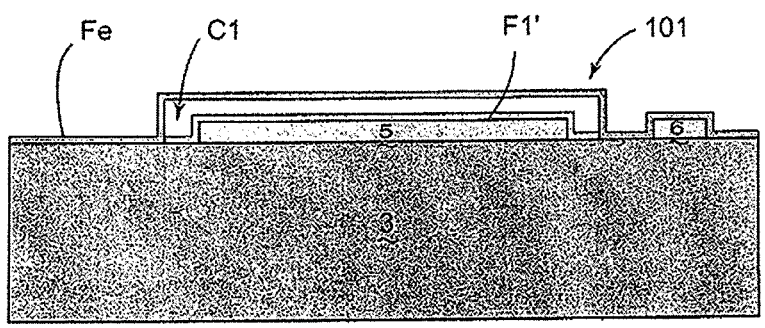
FIG. 12 is a schematic cross-sectional view of the device in FIG. 11 following a step of depositing an inorganic barrier film on this layer C1, after said wet etching step.

The essential difference between the microdisplay encapsulating structure 101 according to the second embodiment of the invention, the fabrication of which is illustrated in FIGS. 10 to 12, and the structure illustrated in FIGS. 1 to 6 is that instead of the inorganic dielectric film F1 another inorganic film F1', which is transparent, is deposited by ALD, this film however being electrically conductive because it is, preferably, made of ZnO or ZnO:Al.

Figure 13:
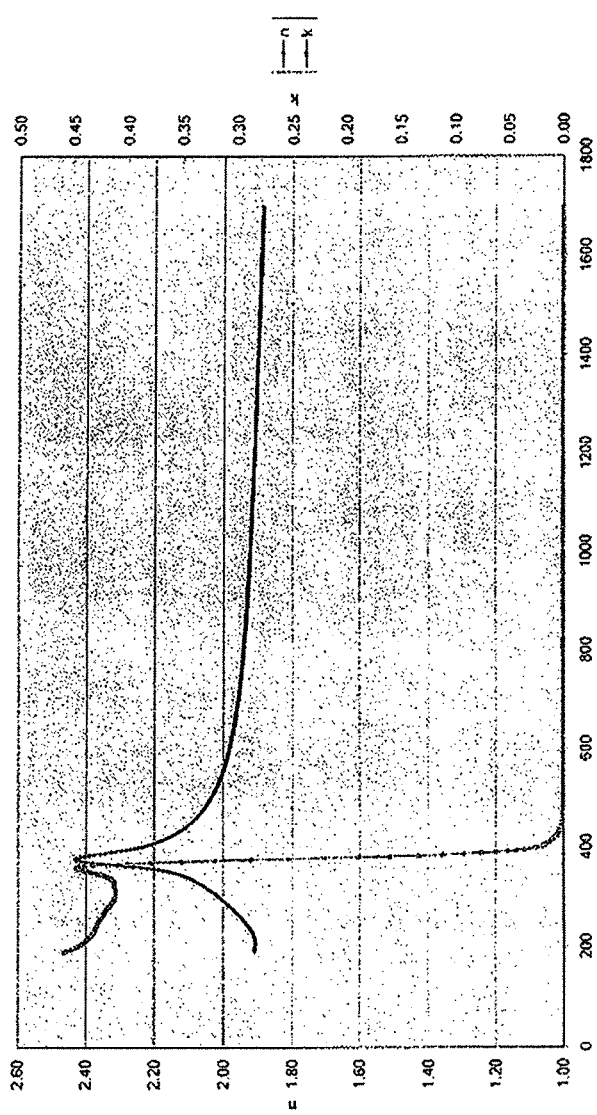
FIG. 13 is a graph relating to the optical properties of the conductive inorganic film F1' according to this second embodiment of the invention, showing two curves of the optical constants n and k, respectively, as a function of the emitted wavelength.

This film F1', based on such an ALD-deposited transparent conductive oxide, especially has the following three advantages:

it may be deposited at a temperature below 100° C., which is recommended in order not to degrade the components of the OLED unit;

as FIG. 13, a graph of optical constants n and k (Savannah 200 films measured using a Woollam system), shows, this film F1' forms an excellent underlayer especially because its constant n is high in the visible domain (its average value being substantially equal to 2); and the ALD deposition contributes to production of a high-quality encapsulation.

As may be seen in FIG. 10, this film F1' is first deposited over the entire surface of the OLED unit 4 (including the connection zone 6) before the coating, exposure and development of the photosensitive layer C1, which layer C1 protrudes with respect to the active zone 5 in a similar way to the layer C1 in the first embodiment of the invention. It will be noted that this initial conductive-film F1' coating has the effect of short-circuiting the fields and the connection zones 6.

Next, as may be seen in FIG. 11, a subsequent step of wet etching the film F1' (for example with an acid solution, for example based on HCl diluted in deionized water) is carried out so as to selectively remove it from regions beyond the polymerized layer C1 (and therefore especially from the connection zone 6), this wet etch using said layer C1 as a mask.

Next, as may be seen in FIG. 12, an inorganic barrier film Fe is deposited (for example an $Al_2O_3$ film deposited by ALD) over the entire OLED unit 4 on this layer C1, similarly to the first embodiment of the invention.

Figure 14:
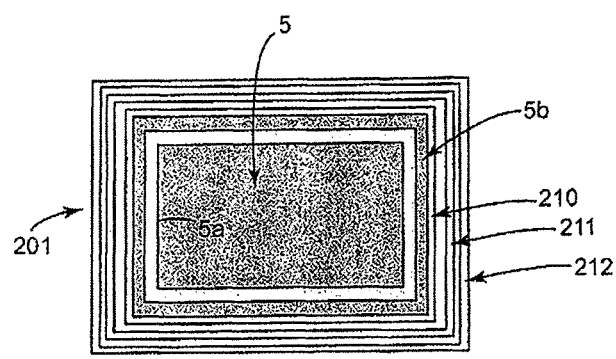
FIG. 14 is a schematic top view of a microdisplay of a device according to another exemplary embodiment of the invention, showing, for the photosensitive layer C1 covering this microdisplay surmounted with an inorganic film F1, two auxiliary enveloping portions lying a distance away from and around an enveloping portion that continuously surpasses the active zone.
Figure 15:
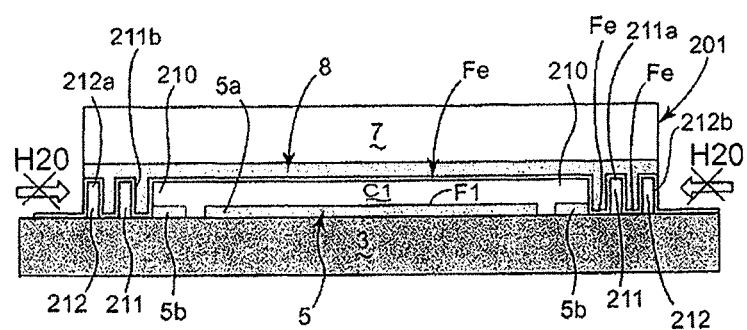
FIG. 15 is a schematic cross-sectional view of the microdisplay in FIG. 14 furthermore showing a transparent protective cap adhesively bonded to an external inorganic barrier film surmounting said layer C1.

The photosensitive layer C1 of the encapsulating structure 201 according to the variant of the invention illustrated in FIGS. 14 and 15 covers the active zone of the microdisplay (which active zone 5 is surrounded by a cathode ring 5b forming the external electrode and is surmounted by an inorganic film F1, for example analogously to that shown in FIGS. 1 to 6) and has two auxiliary enveloping portions 211 and 212 lying peripherally at a distance away from, via a suitable photolithography mask, and around a central enveloping portion 210 that continuously surpasses the active zone 5. More precisely, it may be seen in figure that these auxiliary portions 211 and 212 form reliefs (with a rectangular cross section in the example in FIG. 15) of the same height, and of the same height as the central portion 210, and that these auxiliary portions 211 and 212 are connected together at their bases by the external dielectric barrier film Fe (by way of nonlimiting example based on $Al_2O_3$ deposited by ALD) that both coats their tops 211a, 212a and their sidewalls 211b, 212b.

Furthermore, as illustrated in FIG. 15 where the transparent protective cap 7 is moreover shown adhesively bonded to the external inorganic barrier film Fe surmounting the layer C1, these two auxiliary enveloping portions 211 and 212, obtained by photolithography, still further minimize lateral penetration of external water vapor by diffusion, by virtue of the increased number of the barrier interfaces of the external film Fe covering the sidewalls 211b and 212b of the auxiliary portions 211 and 212 (four sidewalls in the example in FIG. 15).

The invention claimed is:

1. An organic optoelectronic device, such as a display, lighting or signaling device employing organic light-emitting diodes (OLEDs), this device comprising a light-emitting unit possessing at least one active light-emitting zone coated with a sealed encapsulating multilayer structure, and an electrical connection zone adjacent the or each active zone, the encapsulating structure comprising n (n≥1) inorganic film F1, . . . , Fn/photosensitive polymer layer C1, . . . , Cn multilayer(s) including an internal multilayer F1/C1, where the film F1 covers the or each active zone and is surmounted by the layer C1 which is deposited in liquid phase, wherein the or each layer C1, ..., Cn is patterned and covers the film F1, ..., Fn by extending around a peripheral edge of the or each active zone in at least one structured enveloping portion that ends short of the adjacent connection zone, and in that if n ≥2 the or each layer C2, ..., Cn is structured to envelope the layer C1, ..., Cn-1 of the multilayer immediately subjacent, such that the or each layer C1, ..., Cn passivates the film F1, ..., Fn and protects the sides of the or each subjacent active zone from solvents and developing solutions used to pattern this layer C1, ..., Cn.

2. The device as claimed in claim 1, wherein the or each layer C1, ..., Cn is based on a positive photolithography resist.

3. The device as claimed in claim 1, wherein the or each film F1, ..., Fn is deposited by atomic layer deposition (ALD) or else by plasma enhanced chemical vapor deposition (PECVD), and is based on at least one inorganic compound selected from the group consisting of compounds of formula $Al_xO_y$, $SiO_x$, $Si_xN_y$, $SiO_xN_y$, ZnSe, $Sb_2O_3$ and of transparent conductive oxides (TCOs) optionally combined with a metal.

4. The device as claimed in claim 3, wherein the or each film F1, ..., Fn is deposited by ALD and is based on at least one aluminum oxide $Al_xO_y$, optionally combined with a compound of formula $SiO_x$, $Si_xN_y$ or $SiO_xN_y$, and in that said at least one enveloping portion of the or each layer C1, ..., Cn extends on the light-emitting unit beyond the periphery of this film.

5. The device as claimed in claim 3, wherein the or each film (F1') is deposited by ALD and is based on at least one transparent conductive oxide (TCO) optionally combined with a metal, such as a zinc oxide of formula ZnO or a thin film of ZnO:Al, and in that said at least one enveloping portion of the or each layer C1, ..., Cn extends to make contact with the periphery of this film.

6. The device as claimed in claim 1, wherein the or each layer C1, ..., Cn isolating the or each active zone is itself covered with an external inorganic dielectric barrier film (Fe) that surmounts both the or each active zone and covers all of its or its corresponding last layer C1, ..., Cn and its adjacent connection zone, so as to isolate said at least one enveloping portion of this layer from the exterior.

7. The device as claimed in claim 1 wherein a protective plate is furthermore provided, which plate is bonded under pressure to the encapsulating structure surmounting the or each active zone by means of an adhesive, and in that said portion enveloping the or each active zone is indented, for example giving it a regularly crenellated shape, so as to maximize the contact between the adhesive and the regions of the light-emitting unit located between two adjacent enveloping portions without adversely affecting the adhesion of the latter to this unit.

8. The device as claimed in claim 6, wherein the or each layer C1, ..., Cn is patterned so that said at least one enveloping portion that this layer includes comprises a protruding peripheral enveloping portion that continuously surpasses said edge of the or each active zone by encapsulating the latter, and at least one auxiliary peripheral enveloping portion that lie(s) at a distance away from and surround(s) this protruding portion and that, in the case of a plurality of auxiliary portions, mutually surround one another, and in that said external inorganic dielectric barrier film (Fe) covers these auxiliary portions so as to form a plurality of surfaces that lie parallel to one another and perpendicular to the plane of the substrate, which surfaces form as many obstacles to lateral penetration of water vapor toward the or each active zone.

9. The device as claimed in claim 1, wherein the device comprises a multitude of active zones, which zones are all surmounted by films F1, ..., Fn and by layers C1, ..., Cn that each surpass said subjacent edge but that lie a distance away from said adjacent enveloping portion of each neighboring active zone, an external inorganic dielectric film (Fe) surmounting the layers or respective last layers of the active zones while also covering their adjacent connection zones.

10. The device as claimed in claim 9, wherein the device forms at least one color microdisplay that is defined by the or each active zone and that comprises color filters or color-changing means opposite color dots corresponding to each pixel of the microdisplay.

11. The device as claimed in claim 1, comprising a substrate coated, on at least one of its sides, with said light-emitting unit, said light-emitting unit being an OLED unit comprising at least two internal and external electrodes between which a light-emitting structure is sandwiched and at least one of which is transparent to the emitted light, wherein the encapsulating structure covers said external electrode.

12. A process for encapsulating a device as claimed in claim 1 claims, wherein the process comprises the following steps in succession:
a) an internal inorganic film F1 is deposited on said at least one active zone, for example on an external electrode of the light-emitting unit, by atomic layer deposition (ALD) or else by plasma enhanced chemical vapor deposition (PECVD), this film F1 being based on at least one inorganic compound selected from the group consisting of compounds of formula $Al_xO_y$, $SiO_x$, $Si_xN_y$, $SiO_xN_y$, ZnSe, $Sb_2O_3$ and of transparent conductive oxides (TCOs);
b) the light-emitting unit is covered with an internal, photosensitive polymer layer C1 deposited in its liquid phase, for example by spin coating, so that said layer continuously covers the or each film F1 and also the adjacent connection zone, an adhesion promoter, for example a silane, optionally being deposited beforehand on this film F1;
c) the layer C1 is exposed in preset regions of the light-emitting unit by selectively masking it from exposing radiation, so that it is, on the one hand, polymerized following this exposure above the or each active zone covered with the film F1 and in said at least one enveloping portion lying a distance away from the enveloping portion of the or each adjacent active zone and, on the other hand, depolymerized over the rest of the area of the unit including the or each connection zone, so that the polymerized layer C1 encapsulates the film F1 and the or each active zone so as to protect them during step d);
d) the polymerized layer C1 is developed by soaking in a bath, for example of tetramethylammonium hydroxide, optionally followed by an additional exposure of the layer C1; and then
e) these steps a) to d) are repeated at least once, at least one other inorganic film F2, ..., Fn/photosensitive polymer layer C2, ..., Cn multilayer being deposited, the or each film F2, Fn being deposited on the layer C1, ..., Cn-1 and the or each polymerized layer C2, ...,Cn enveloping the layer C1, ..., Cn-1.

13. The process as claimed in claim 12, wherein a layer based on a positive photolithography resist is used by way of the layer C1, ..., Cn, and in that, in step
c), the layer C1, ..., Cn surmounting the or each active zone is selectively masked by means of a mask facing and surpassing said peripheral edge so that this layer is thereby protected from exposure and remains polymerized including in said at least one corresponding enveloping portion, in contrast to the rest of this layer C1, ..., Cn which is depolymerized by this exposure with a view to dissolving it.

14. The process as claimed in claim 12, wherein at least one dielectric inorganic compound selected from the group consisting of compounds of formula $Al_xO_y$, $SiO_x$, $Si_xN_y$, $SiO_xN_y$, ZnSe and $Sb_2O_3$ is used for the or each film F1, Fn to be deposited in step a), and in that, following step d), said at least one enveloping portion of the or each layer C1, ..., Cn extends, on the light-emitting unit (4), beyond the periphery of this film.

15. The process as claimed in claim 12, wherein at least one transparent conductive oxide (TCO), such as a zinc oxide of formula ZnO or a thin film of ZnO:Al, is used for the or each film (F1') to be deposited in step a), and in that, following step d), this film is wet etched using the protruding polymerized layer C1, ..., Cn surmounting the or each active zone as a mask so that said at least one enveloping portion of this layer extends to make contact with the periphery of this film and so that the latter is removed from the unit everywhere else.

16. The process as claimed in claim 12, wherein, following step d), the or each polymerized layer C1, ..., Cn is etched using a dry etching operation, such as a reactive ion etching (RIE) process or an oxygen plasma, so as to reduce the thickness of said layer.

17. The process as claimed in claim 12, wherein, following step d), an external inorganic barrier film (Fe) is conformally deposited at a low temperature, said film both surmounting the or each active zone and covering all of the corresponding layer C1, ..., Cn and its adjacent connection zone so as to isolate said at least one enveloping portion of this layer from the exterior, this conformal deposition preferably being produced by atomic layer deposition (ALD) or plasma enhanced chemical vapor deposition (PECVD) of at least one dielectric compound.

* * * * *

UNITED STATES PATENT AND TRADEMARK OFFICE
CERTIFICATE OF CORRECTION

PATENT NO. : 8,698,396 B2
APPLICATION NO. : 13/640841
DATED : April 15, 2014
INVENTOR(S) : Maindron et al.

Page 1 of 1

It is certified that error appears in the above-identified patent and that said Letters Patent is hereby corrected as shown below:

In the claims:

Column 12,
Lines 57 and 58, "the or each film F2, Fn being deposited on the layer C1," should read
--the or each film F2, ..., Fn being deposited on the layer C1,--.

Signed and Sealed this
Eighth Day of July, 2014

Michelle K. Lee
*Deputy Director of the United States Patent and Trademark Office*